United States Patent [19]

Miyauchi et al.

[11] Patent Number: 5,243,192
[45] Date of Patent: Sep. 7, 1993

[54] INFRARED SENSOR

[75] Inventors: Kazuo Miyauchi, Kanagawa; Yoshitaka Natsume; Kohei Mandai, both of Tokyo; Chiharu Suyama, Kanagawa, all of Japan

[73] Assignee: Sony Corporation, Tokyo, Japan

[21] Appl. No.: 676,545

[22] Filed: Mar. 28, 1991

[30] Foreign Application Priority Data

Mar. 29, 1990 [JP] Japan .................................. 2-081709

[51] Int. Cl.$^5$ ............................................ H01L 27/00
[52] U.S. Cl. ................................ 250/338.1; 250/338.4
[58] Field of Search ........................ 250/338.1, 338.4; 357/30; 437/3

[56] References Cited

FOREIGN PATENT DOCUMENTS 285084 10/1988 European Pat. Off. .
364163 4/1990 European Pat. Off. .
2097581 11/1983 United Kingdom .

OTHER PUBLICATIONS

A Planar Monolithic Integrated Photoreceiver: Association of a GaAs Schottky Photodiode with a GaAs FET, Sensors and Actuators, 11 (1987) 239-250.

Primary Examiner—Paul M. Dzierzynski
Assistant Examiner—Richard Hanig
Attorney, Agent, or Firm—Hill, Steadman & Simpson

[57] ABSTRACT

An infrared sensor comprises a substrate, a sensing unit formed on the substrate, and a signal processing circuit formed on the substrate. At least the signal processing circuit is covered with a conductive film to prevent the penetration of infrared radiation into the signal processing circuit so that noise generation attributable to the penetration of infrared radiation into the signal processing circuit is suppressed.

1 Claim, 4 Drawing Sheets

INFRARED SENSOR

BACKGROUND OF THE INVENTION

1. Field of the Invention

The present invention relates to an infrared sensor and, more particularly, to a remote infrared sensor suitable for use on television receivers and tape recorders including video tape recorders.

2. Description of the Prior Art

Recent television receivers and VTRs, in general, are provided with a remote infrared sensor which receives and processes control signals provided by a remote controller. The conventional remote infrared sensor employs a photodetector including a pin diode. The conventional remote infrared sensor comprises a sensing unit having a photodetector employing a pin photodiode, a signal processing circuit comprising a signal amplifier and a frequency band controller, and a metallic box accommodating the sensing unit and the signal processing circuit. This conventional remote infrared sensor comprises about ten component parts and requires assembling processes for assembling those component parts. Therefore, it is difficult to fabricate the remote infrared sensor at a high productivity and to reduce the cost.

FIG. 4 shows a previously proposed remote infrared sensor B intended to improve the productivity of the manufacturing process and to reduce the cost. The remote infrared sensor B is a monolithic remote infrared sensor comprising: a p-type silicon substrate 22; a photodetector 21 comprising a plurality of pn junctions formed, for example, by forming a p-type diffused region on an n-type epitaxial layer on the p-type silicon substrate 22; a signal processing circuit 23 formed on the p-type silicon substrate 22; and bonding pads 24. This remote infrared sensor B can be fabricated at a high productivity and at a relatively low cost.

Since both the photodetector 21 and the signal processing circuit 23 of this previously proposed remote infrared sensor B are formed on the same substrate 22, infrared radiation to be received by the photodetector 21 falls also on the signal processing circuit 23, causing the signal processing circuit 23 to generate noise due to a photocurrent induced therein by the infrared radiation.

SUMMARY OF THE INVENTION

The present invention has been made in view of such a problem, and it is therefore an object of the present invention to provide an infrared sensor having a signal processing circuit, and capable of preventing the penetration of infrared radiation into the signal processing circuit to suppress the generation of noise due to the penetration of infrared radiation into the signal processing circuit.

In one aspect of the present invention, an infrared sensor comprises a substrate, a sensing unit formed on the substrate, and a signal processing circuit formed on the substrate, and characterized in that at least the signal processing circuit is covered with a conductive film.

At least the signal processing circuit formed on the substrate on which the sensing unit is formed is covered with the conductive film which serves as a shield to intercept infrared radiation so that the infrared radiation may not penetrate into the signal processing circuit. Thus, the generation of noise due to the penetration of infrared radiation into the signal processing circuit can be suppressed.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENT

An infrared sensor in a preferred embodiment according to the present invention will be described hereinafter with reference to FIGS. 1 to 3.

Figure 1:
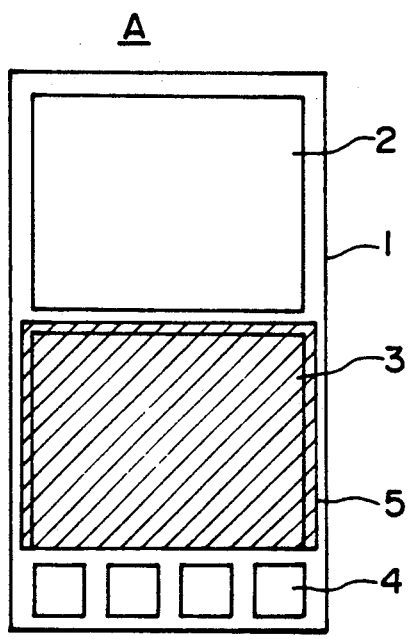
FIG. 1 is a plan view of an infrared sensor in a preferred embodiment according to the present invention.

FIG. 1 is a plan view of an infrared sensor A embodying the present invention.

The infrared sensor A comprises a single silicon substrate 1, a photodetector 2, i.e., a sensing unit, comprising a photodiode and formed on the silicon substrate 1, a signal processing circuit 3 comprising an amplifier for amplifying an infinitesimal signal provided by the photodetector 2, and a frequency band controller, bonding pads 4 formed on the silicon substrate 1, and a conductive film 5 covering the signal processing circuit 3. A first aluminum film and a second aluminum film are formed one over the other. The first aluminum film is used for forming wiring patterns for the signal processing circuit 3, and the second aluminum film is used as both the conductive film 5 for preventing the penetration of infrared radiation into the signal processing circuit 3 and a grounding electrode for the signal processing circuit 3.

Figure 2A:
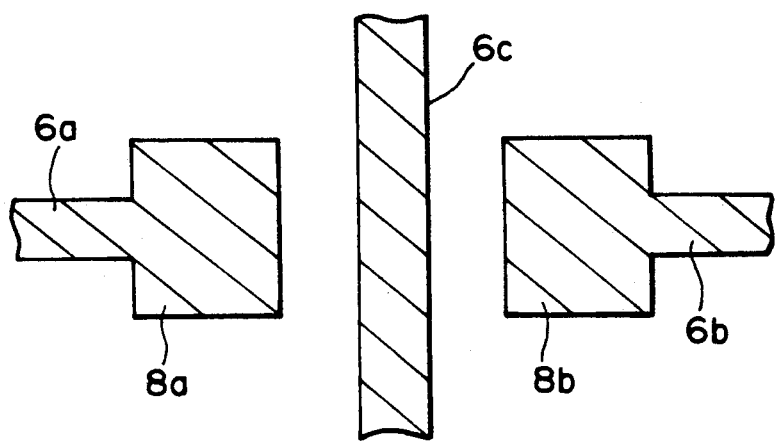
FIGS. 2A, 2B, 2C and 2D are plan views of assistance in explaining a process of connecting wiring patterns by a second aluminum film.
Figure 2B:
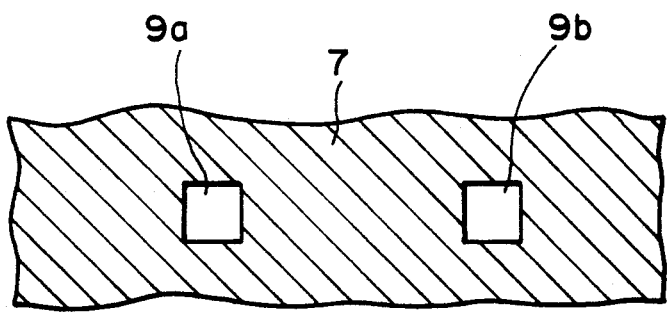
Figure 2C:
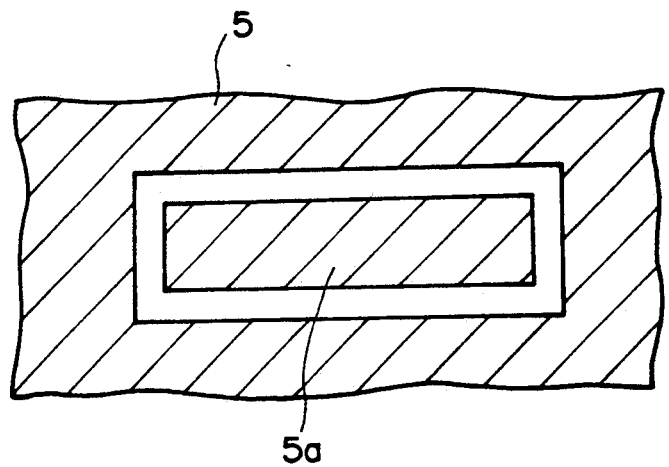
Figure 2D:
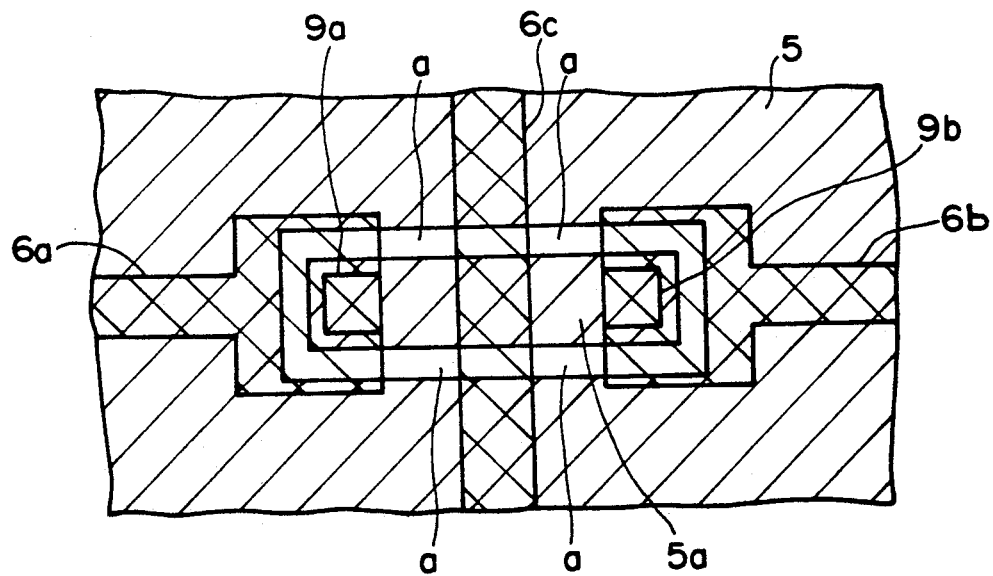
Figure 4:
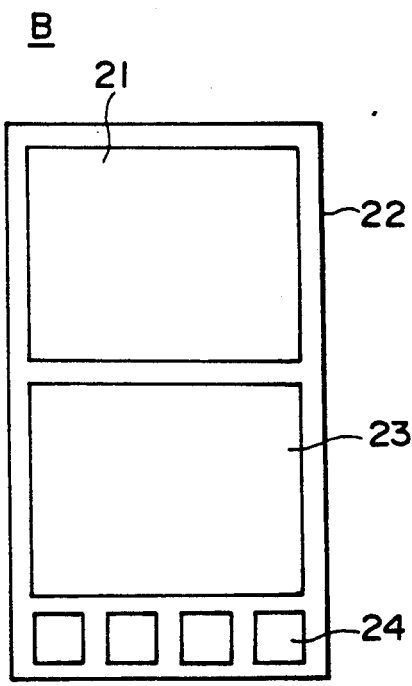
FIG. 4 is a plan view of a conventional infrared sensor.

Since the first aluminum film is unable to form intersecting wiring patterns, portions of the second aluminum film 5 are used also for forming intersecting wiring patterns as shown in FIG. 2D when intersecting wiring patterns are necessary. Suppose that a first wiring pattern 6a and a second wiring pattern 6b are formed opposite to each other and a third wiring pattern 6c is formed between the first wiring pattern 6a and the second wiring pattern 6b as shown in FIG. 2A by patterning the first aluminum film. In electrically connecting the first wiring pattern 6a and the second wiring pattern 6b, an insulating film 7 is formed over the entire surface of the layer including the wiring patterns 6a, 6b and 6c, contact holes 9a and 9b are formed in the insulating film 7 at positions respectively corresponding to the terminal 8a of the first wiring pattern 6a and the terminal 8b of the second wiring pattern 6b as shown in FIG. 2B, the second aluminum film 5 is formed over the entire surface of the insulating film 7, and then the second aluminum film 5 is subjected to a patterning process to form a region 5a interconnecting the two contact holes 9a and 9b to connect electrically the first wiring pattern 6a and the second wiring pattern 6b shown in FIG. 2A by the region 5a. Although gaps a are formed in the second aluminum film 5 as shown in FIG. 2D, the generation of noise which may cause malfunction will not occur because the gaps a are very small. The function of the signal processing circuit 3 may hardly be affected by the penetration of infrared radiation through the gaps a into the signal processing circuit 3 if the front half of the signal processing circuit 3, in which an infinitesimal signal provided by the photodetector 2 is processed, is covered perfectly by the conductive film, i.e., the second aluminum film 5, and the gaps a are formed in the back half of the signal processing circuit 3, in which an amplified signal is processed, in connecting the wiring patterns of the first aluminum film by the wiring patterns of the second aluminum film 5.

Figure 3:
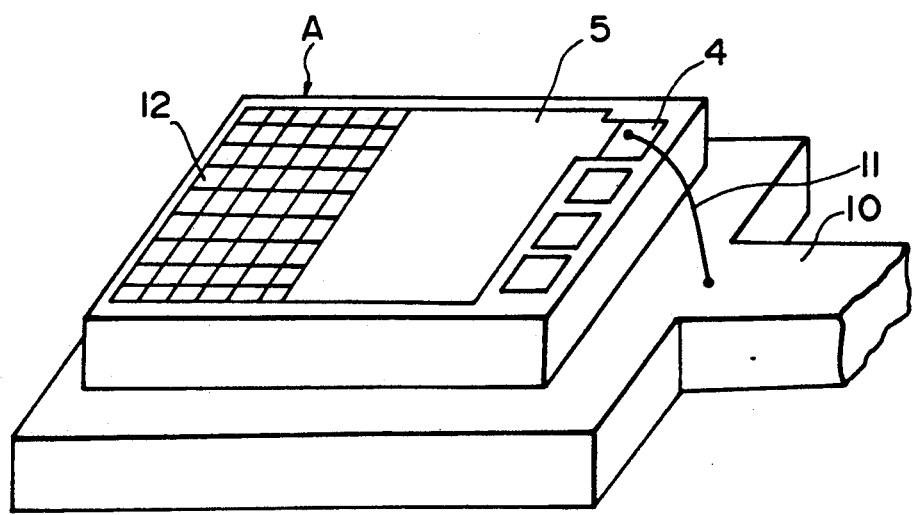
FIG. 3 is a perspective view of the infrared sensor mounted on a lead frame.

The second aluminum film 5 functions as an electromagnetic shield when the second aluminum film 5 of the infrared sensor A is connected to one of the bonding pads 4, and the bonding pad 4 connected to the second aluminum film 5 is connected electrically to a lead frame 10 by a bonding wire 11 as shown in FIG. 3 to equalize the respective potentials of the second aluminum film 5 and the lead frame 10. Since the infrared sensor A is sandwiched between the second aluminum film 5 and the lead frame 10, the lines of electric force of an external electric field are able hardly to penetrate the infrared sensor A, so that the influence of the external electric field on the function of the infrared sensor A is reduced.

As stated above, since both the photodetector 2 and the signal processing circuit 3 are formed on the substrate 1, the number of component parts of the infrared sensor A is reduced to a minimum, and hence the infrared sensor A can be manufactured at a high productivity and at a relatively low cost.

Since the signal processing circuit 3 is covered entirely with the conductive film, i.e., the second aluminum film 5, the penetration of infrared radiation into the signal processing circuit 3 is prevented to reduce the generation of noise due to the penetration of infrared radiation into the signal processing circuit 3 can be reduced.

Since the second aluminum film 5 is used also as a grounding electrode and portions of the second aluminum film 5 are used as jumpers for the wiring patterns formed by the first aluminum film, any grounding line need not be included in the wiring patterns of the first aluminum film in designing the layout of the wiring patterns and the entire surface of the chip can effectively be used, which facilitates designing the layout of the wiring patterns and increases the degree of freedom of designing the layout.

Furthermore, since the second aluminum film 5 and the lead frame 10 are equipotential and sandwich the infrared sensor A therebetween, the second aluminum film 5 and the lead frame 10 serve as both an electromagnetic shield and an electric field shield. Accordingly, the influence of an electromagnetic field and an electric field created, for example, by a television receiver or a VTR on the performance of the signal processing circuit 3 can be suppressed.

Although the second aluminum film 5 in this embodiment is formed over the signal processing circuit 3, the second aluminum film 5 may be formed over the entire surfaces of the photodetector 2 and the signal processing circuit 3 excluding the bonding pads 4, and a region of the second aluminum film 5 covering the photodetector 2 may be patterned to form a plurality of apertures 12 as shown in FIG. 3. Such a configuration enables the second aluminum film 5 to function as an electromagnetic shield without reducing the quantity of incident infrared radiation on the photodetector 2 and reduces efficiently the influence of the external magnetic field created by a television receiver or a VTR on the performance of the photodetector 2.

The infrared sensor in accordance with the present invention has a construction capable of preventing the penetration of infrared radiation into the signal processing circuit to suppress the generation of noise due to the penetration of infrared radiation into the signal processing circuit.

What is claimed is:

1. An infrared sensor comprising:
   a substrate;
   a sensing unit formed on said substrate;
   a signal processing circuit formed on said substrate;
   a first layer of conductive film for forming a first wiring pattern for said signal processing circuit;
   a second layer of conductive film for covering at least said signal processing circuit wherein said second layer may be used to form a second wiring pattern intersecting said first wiring pattern;
   an insulating film for covering said first layer and said second layer; and
   a plurality of contact holes formed in said insulating film, each of said plurality of contact holes corresponding to a respective terminal in said wiring patterns.

* * * * *